United States Patent [19]
Moser

[11] Patent Number: 6,121,799
[45] Date of Patent: Sep. 19, 2000

[54] INTERLEAVED DIGITAL PEAK DETECTOR

[75] Inventor: Michael F. Moser, Beaverton, Oreg.

[73] Assignee: Tektronix, Inc., Beaverton, Oreg.

[21] Appl. No.: 09/302,016

[22] Filed: Apr. 29, 1999

[51] Int. Cl.$^7$ ...................................................... H03K 5/22
[52] U.S. Cl. ................................ 327/58; 327/62; 342/45; 342/70
[58] Field of Search .............................. 348/46; 370/516, 370/517; 342/45, 70; 702/43; 714/780; 327/58, 62, 74, 75

[56] References Cited

U.S. PATENT DOCUMENTS

| | | | |
|---|---|---|---|
| Re. 35,996 | 12/1998 | Rasmussen | 702/43 |
| 4,897,659 | 1/1990 | Mellon | 342/45 |
| 5,684,850 | 11/1997 | Warburton et al. | 378/53 |
| 5,872,536 | 2/1999 | Lyons et al. | 342/70 |

Primary Examiner—Tuan T. Lam
Assistant Examiner—Hiep Nguyen
Attorney, Agent, or Firm—William K. Bucher

[57] ABSTRACT

An interleaved digital peak detector has multiple acquisition pipes with each pipe receiving a common input signal. Each acquisition pipe receives a common sample clock signal that is delayed through an analog delay circuit for selectively delaying the sample time of each analog-to-digital converter in the pipe. Each pipe has peak detector that receives the digitalized output from the analog-to-digital converter and accumulates maximum and minimum peak values. A programmable decimator receives the sample clock signal and a decimation value for establishing an acquisition clock by decimating the sample clock signal as a function of the decimation value to trigger a latch circuit for storing the accumulated maximum and minimum values from the peak detector. An acquisition memory stores the latched the maximum and minimum peak detector values over an acquisition interval and the maximum and minimum peak detector values from each of the acquisition pipes are compared over the acquisition interval under program control for generating a maximum and a minimum peak detector value over the acquisition interval for the acquisition pipes.

9 Claims, 3 Drawing Sheets

FIG.2A
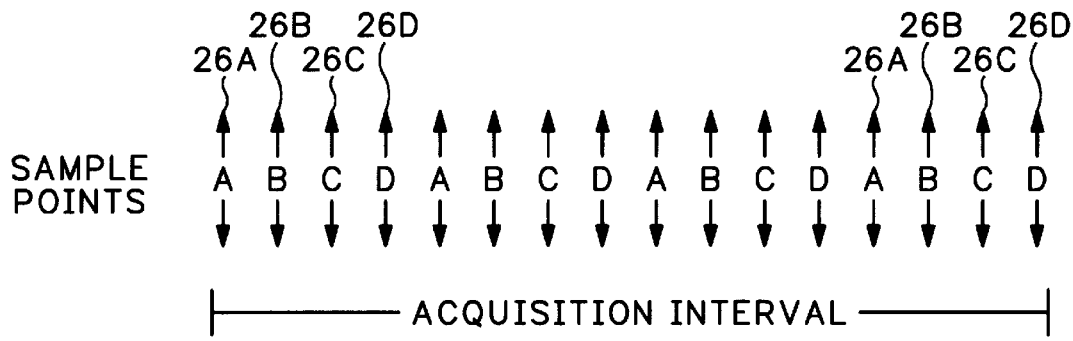
FIG.2B
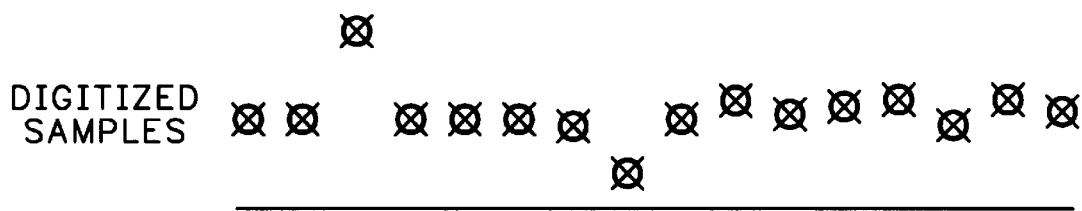
FIG.2C
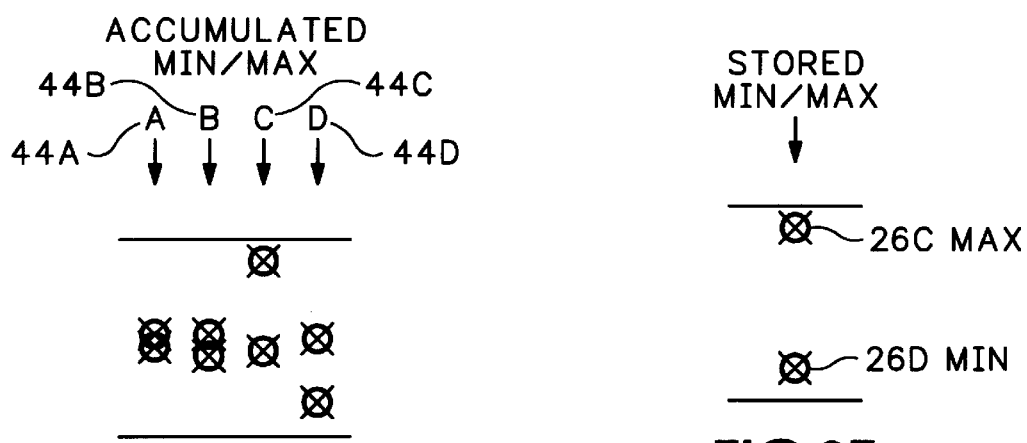
FIG.2D　　FIG.2E

INTERLEAVED DIGITAL PEAK DETECTOR

BACKGROUND OF THE INVENTION

The present invention relates generally to digital peak detection and more specifically to digital peak detection circuitry and acquisition mode that is usable in a measurement test instrument, such as an oscilloscope.

High speed digital measurement instruments, such as oscilloscopes, digitizers, and the like, use interleaved acquisition pipes for acquiring digitized samples of an input signal in an acquisition channel. A common sample clock is used to drive circuitry in each pipe with each pipe's sample clock being delayed from the other pipes' sample clocks. Each pipe has a track-and-hold that samples the incoming signal, an analog-to digital converter that digitizes the analog sample, and a demultiplexer that decimates the digitized samples at a user selected acquisition rate. The decimated digitized acquisition samples from each pipe are interleaved and stored in memory for display and/or further processing. The interleaved stored samples provide a maximum channel acquisition rate that is effectively N times greater than the sample clock rate where N is the number of acquisition pipes.

The TDS 700 Series Oscilloscopes, manufactured and sold by Tektronix, Inc., Wilsonville, Oreg., and assignee of the present invention, include a digital peak detect acquisition mode that is used during slow acquisitions to detect high-speed events occurring between regular acquisition samples. During digital peak detect, one of the acquisition pipes acquires samples at the maximum sample rate of the pipe and accumulate a minimum value and a maximum value of the high speed samples over the period of the slower requested acquisition rate. The minimum and maximum values over each acquisition interval are stored in memory for display. This method is limited to capturing events with a duration that is greater than or equal to the sampling rate of the acquisition pipe.

What is needed is an apparatus and method for acquiring shorter duration events during the digital peak detection acquisition function.

SUMMARY OF THE INVENTION

Accordingly, the present invention is directed to an interleaved digital peak detector and method of operation that includes a plurality of acquisition pipes coupled to receive an input signal. Each acquisition pipe has an analog-to-digital converter that receives the input signal and a sampling clock signal. The sampling clock signal for each pipe is coupled through a delay circuit to selectively delay the sampling of the input signal for each acquisition pipe. A peak detector receives the output from the analog-to-digital converter and accumulates maximum and minimum values of the digitized input signal. An acquisition circuit receives an acquisition signal that establishes an acquisition clock by decimating the sampling clock signal as a function of a decimation value for triggering a latch circuit that stores the accumulated maximum and minimum values from the peak detector. A controller, operating under program control, compares the maximum and minimum peak detector value or values from each of the acquisition pipes over an acquisition interval and generates a maximum and a minimum peak detector value over the acquisition interval for the plurality of acquisition pipes.

In a further refinement of the interleaved digital peak detector of the present invention, a track-and-hold circuit captures an analog value of the input signal for input to the analog-to-digital converter. In the preferred embodiment of the present invention, the acquisition circuit includes an acquisition memory for storing the latched maximum and minimum peak detector values over the acquisition interval. The acquisition circuit may further include a demultiplexer acting as a programmable decimator that receives the sampling signal and a decimation value for establishing an acquisition clock signal by decimating the sampling signal as a function of the decimation value. An acquisition clock triggers a latch circuit for storing the accumulated maximum and minimum values from the peak detector.

The method for detecting maximum and minimum digital values using the interleaved digital peak detector includes the steps of digitizing an input signal using multiple acquisition pipes with each pipe having an analog-to-digital converter that receives a common sampling clock signal that is adjustably delayed by a delay circuit in each of the pipes. The maximum and minimum peak values of the digitized input signal in each acquisition pipe are accumulated over an acquisition interval and stored. The stored accumulated maximum and minimum peak values of the digitized input signal from each of the acquisition pipes over the acquisition interval are compared to generate a maximum value and a minimum peak value over the acquisition interval. The maximum and minimum peak values over the interval are displayed. The digitizing, accumulating, storing, and comparing steps are repeated over additional acquisition intervals to build an acquisition record that is displayed. The digitizing step also includes that additional step of capturing an analog value of the input signal at the instant of the sampling clock for digitizing by the analog-to-digital converter.

The objects, advantages and novel features of the present invention are apparent from the following detailed description when read in conjunction with the appended claims and attached drawings.

BRIEF DESCRIPTION OF THE DRAWINGS

The present invention is illustrated by way of example in the figures of the accompanying drawings, in which like references indicate similar elements and in which:

FIG. 2A is a waveform diagram illustrating an analog input waveform to the digital peak detector according to the present invention.

FIG. 2B is a sample point diagram illustrating the sampling of the input waveform using the digital peak detector according to the present invention.

FIG. 2C is a digitized sample diagram illustrating the acquired digital samples using the digital peak detector according to the present invention.

FIG. 2D is a accumulated digital sample diagram illustrating the accumulation of digital samples in the digital peak detectors in the digital peak detector according to the present invention.

FIG. 2E is a stored sample diagram illustrating the stored digital maximum and minimum digital samples from the digital peak detector according to the present invention.

DETAILED DESCRIPTION OF THE PREFERRED EMBODIMENT

In the following detailed description numerous specific details are set forth in order to provide a thorough understanding of the present invention. However, it will be understood by those skilled in the art that the present invention may be practiced without these specific details. In other instances well known methods, procedures, components, and circuits have not been described in detail so as not to obscure the present invention.

Additionally, various operations will be described as multiple discrete steps in turn in a manner that is most helpful in understanding the present invention, however, the order of description should not be construed as to imply that these operations are necessarily order dependent, in particular, the order of their presentation.

Figure 1:
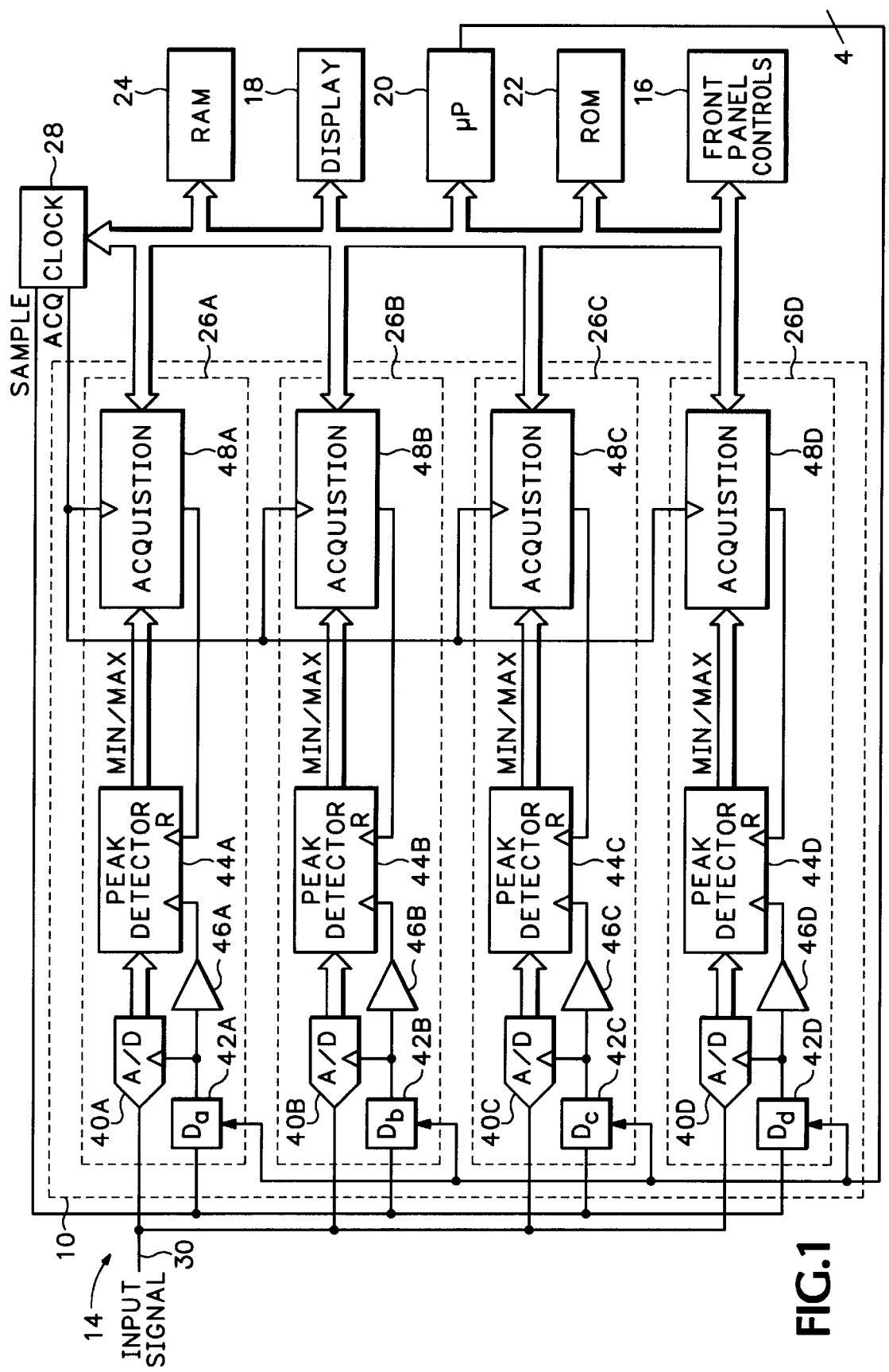
FIG. 1 is a block diagram illustrating the digital peak detector according to the present invention.

Referring to FIG. 1, there is shown a block diagram illustrating the digital peak detector 10 according to the present invention. The digital peak detector 10 may be incorporated into a measurement test instrument, such as a digital oscilloscope, digitizer, or the like. Such instruments include one or more acquisition channels 14, a front panel 16 having multiple controls, such as knobs, buttons and the like, and a display 18, such as a cathode ray tube, liquid crystal display, or the like. Internally, the instrument is controlled by one or more microprocessors 20 executing program instructions stored in a ROM memory 22. Data acquired by the acquisition channel 14 is stored in a RAM memory 24. The acquisition channel 14 includes multiple acquisition pipes 26A, 26B, 26C, and 26D of which four are exemplary shown. The invention may be implemented with any number of acquisition pipes with the preferred number being an integer power of two (e.g. 2, 4, 8, 16 . . . ). A system clock 28 provides one or more output clock signals for driving circuits within the instrument including the digital peak detector 10 circuits.

Each acquisition pipe 26A, 26B, 26C, and 26D includes an analog-to-digital converter 40A, 40B, 40C and 40D that receives a common input signal 30. Each acquisition pipe also includes a delay circuit 42A, 42B, 42C and 42D that receives a common sample clock and a unique delay value or voltage from the microprocessor 20. The delay circuits provide sample clocks to the respective analog-to digital converters 40A, 40B, 40C and 40D which produce digital values representative of the input signal. The digital values from each of the analog-to-digital converters are coupled to their respective digital peak detectors 44A, 44B, 44C, and 44D. The digital peak detectors 44A, 44B, 44C, and 44D are driven by the same sample clock signals that drive the analog-to-digital converters 40A, 40B, 40C and 40D but are appropriately delayed to account for propagation delay and conversion time as represented by delays 46A, 46B, 46C, and 46D. The digital peak detectors 44A, 44B, 44C, and 44D accumulate peak maximum and minimum digital values and provides the values to respective acquisition circuits 48A, 48B, 48C and 48D. The acquisition circuits receives an acquisition clock signal that latches the peak maximum and minimum over an acquisition interval and stores the values into respective acquisition memories. In the preferred embodiment of the present invention, the acquisition interval for the digital peak detector 10 includes two acquisition clock cycles which will discussed in greater detail below. The microprocessor 20, under program control, compares the respective accumulated maximum and minimum peak values for the respective pipes and stores the maximum and minimum accumulated peak values of all of the pipes as the maximum and minimum peak values over the acquired interval. The stored maximum and minimum peak values for the interval are displayed on display 18.

The delay values or voltages from the microprocessor 20 adjusts the sample times of the analog-to-digital converters 40A, 40B, 40C and 40D to provide an effective sampling rate that is N times the sample clock rate where N is the number of acquisition pipes. For example, the sample clock rate is 1 GSamples/sec or 1 nanosec. Equally dividing the 1 nanosec rate by 4 (the number of acquisition pipes) gives a result of 250 picosec. The respective delay circuits add the 250 picosec delay to the sample clock signal with respect to the preceding pipe that drives the circuitry of each pipe. The delay of each analog-to-digital converter's clock signal is set to an increment of 1/N * sample_clock_period, so that each analog-to-digital converter is capturing a unique time slice between sample clocks. Interleaving the resulting digital data from the four acquisition pipes results in an effective sampling rate of 4 times the actual sample rate. The analog-to-digital converters 40A, 40B, 40C, and 40D generate digital values representative of the input signal at specific time intervals defined by the respective clock signals coming out of the respective delay circuits 42A, 42B, 42C and 42D.

The digital peak detectors 44A, 44B, 44C, and 44D accumulate both the maximum and minimum digitized values from the analog-to-digital converters 40A, 40B, 40C, and 40D as is well known to those of skill in the art. The accumulated maximum and minimum digital values of the peak detectors 44A, 44B, 44C, and 44D are coupled to the acquisition circuits 48A, 48B, 48C and 48D that latch the respective maximum and minimum digital values on receiving an acquisition clock pulse. The acquisition clock rate is a user defined setting selected using the front panel controls 16. The acquisition clock may be generated in a number of ways with FIG. 1 illustrating one way. The system clock 28 may include a programmable decimator that receives decimation values from the microprocessor 20. The decimation values are derived from the user defined acquisition rate set using the front panel 16. For example, the sample clock rate is 1 GSAMPLES/sec and the user defined acquisition sample rate is set at 1 MSamples/sec. Dividing the sample clock rate by the user defined acquisition rate produces a decimation value of 1000. Another way of generating the acquisition clock is to provide decimators in each of the acquisition circuits as shown in FIG. 3 and described in greater detail below.

Both the maximum and minimum peak detector values are provided to the acquisition circuits 48A, 48B, 48C and 48D at the same time. Because of the size of the memory data bus used in the preferred embodiment of the present invention, two acquisition clocks are require to load the respective values into the acquisition memory. This establishes an acquisition interval for the digital peak detection mode at two acquisition clock cycles. Reset strobes are provided to the peak detectors 44A, 44B, 44C, and 44D from the respective acquisition circuits 48A, 48B, 48C and 48D on every other acquisition clock cycle which cause the detectors to store the next incoming digital value as the initial maximum and minimum digital values for the next acquisition interval. The accumulated maximum and minimum digital values of the peak detectors are stored in acquisition memories as previously described. It is apparent that a wider memory bus would allow the storing of the accumulated maximum and minimum digital values using a single acquisition clock and thus establishing an acquisition interval on each acquisition clock. In the preferred embodiment the acquisition memories are part of the acquisition circuits 48A, 48B, 48C and 48D but the memories may be part of the RAM 24 of the instrument.

FIGS. 2A through 2E illustrate the acquisition and processing of the digital samples in the interleaved digital peak detector 10 according to the present invention. Like elements of FIGS. 2A through 2E are labeled the same as in FIG. 1. The figures illustrate one of many acquisition intervals with the representative interval shown being four times the sample interval. FIG. 2A shows a representative input signal 30. FIG. 2B shows the sample points on the input waveform using the four interleaved acquisition pipes 26A, 26B, 26C and 26D for an acquisition interval. FIG. 2C representatively shows the digitized samples of the input signal 30 in FIG. 1 at the sample locations of FIG. 2B for each of the four acquisition pipes 26A, 26B, 26C and 26D. FIG. 2D representatively shows the maximum and minimum accumulated values in the respective digital peak detectors 44A, 44B, 44C, and 44D. FIG. 2E representatively shows the results of the comparison of the maximum and minimum accumulated values of FIG. 2D to generate the stored maximum and minimum peak digital value or values over the acquisition interval. Note that the maximum peak detected value is generated from acquisition pipe data 26C and the minimum peak detected value is generated from acquisition pipe date 26D.

Figure 3:
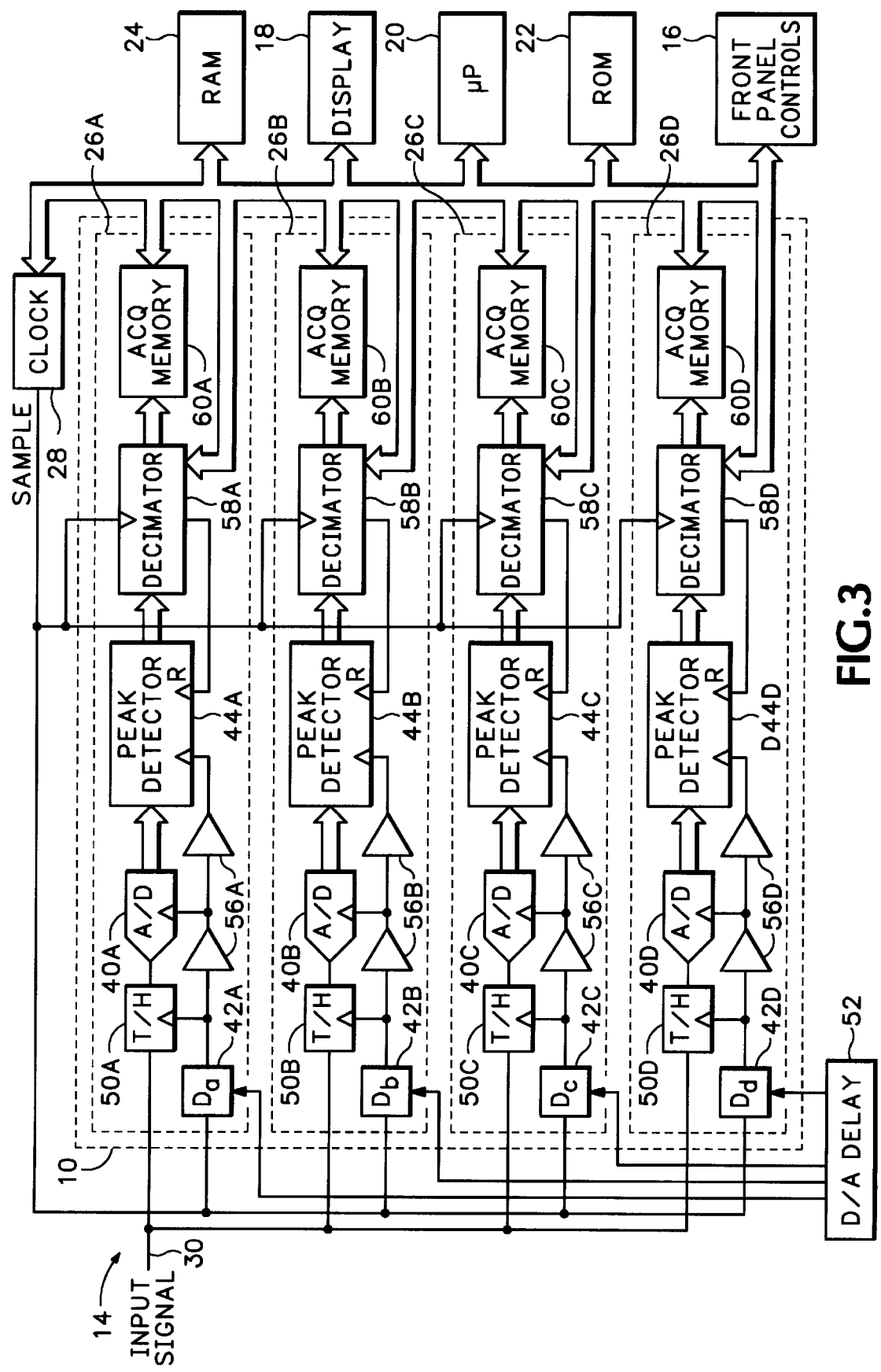
FIG. 3 is a more detailed block diagram illustrating the digital peak detector according to the present invention.

FIG. 3 shows a more detailed block diagram of the digital peak detector 10 according to the present invention. Like elements of FIG. 3 are labeled the same as in FIG. 1. As previously described, the digital peak detector 10 is part of a measurement instrument having multiple acquisition channels 14, a front panel 16, a display 18, a microprocessor type controller 20, associated ROM 22 and RAM 24 memory, and a system clock 28. Each of the acquisition channels 14 has multiple acquisition pipes 26A, 26B, 26C and 26D. Each acquisition pipe includes an analog-to-digital converter, respectively numbered 40A, 40B, 40C, and 40D, a digital delay circuit 42A, 42B, 42C and 42D and a peak detector 44A, 44B, 44C, and 44D. In the preferred embodiment of the present invention, track and hold circuits 50A, 50B, 50C and 50D are respectively associated with each of the analog-to-digital converters 40A, 40B, 40C, and 40D. The delay values or signals applied to the delay circuits 42A, 42B, 42C and 42D are generated by a digital-to-analog delay circuit 52 that receives digital values from the microprocessor 20. As previously described, the delay values applied to the delay circuits 42A, 42B, 42C and 42D adjustably delay the common sample clock signal from system clock 28 to each of the acquisition pipes 26A, 26B, 26C and 26D to offset the sampling time of each pipe with respect to the other by a certain amount. In the preferred embodiment of the present invention, the sample clock rate is at 2.5 GSAMPLES/sec with each pipe sample clock being clocked at 400 picoseconds. The delay offset for each pipe's clock is 100 picoseconds with respect to the preceding pipe producing an effective sample rate of 10 GSamples/sec. The delayed sample clocks are applied to respective track-and-hold circuits 54A, 54B, 54C and 54D in each of the acquisition pipes 26A, 26B, 26C and 26D. The track-and-hold circuits sample the analog input signal 30 at the delayed sample rate and couple the sampled analog signal to the respective analog-to-digital converters 40A, 40B, 40C and 40D. In the preferred embodiment of the invention, the sample clocks for each of the acquisition pipes 26A, 26B, 26C and 26D are provided to the other circuit elements of the pipes using appropriate timing delays as represented by delay elements 56A, 56B, 56C and 56D. The analog-to-digital converters 40A, 40B, 40C and 40D convert the sampled analog signals into digital values and couple the values to the digital peak detectors 44A, 44B, 44C, and 44D. The digital peak detectors 44A, 44B, 44C, and 44D accumulate the maximum and minimum peak digital values over an acquisition interval and passes the accumulated peak values to respective programmable decimator circuits 58A, 58B, 58C and 58D.

Each programmable decimator circuit 58A, 58B, 58C and 58D include a programmable decimator that receives the sample clock signal from the system clock 28 or more preferably from the same timing chain that drives the other circuits within each pipe. A decimation value from the microprocessor 20 is applied to the decimators in response to the user provided acquisition clock rate from the front panel 16. The decimated sample clock generates an acquisition clock that latches the accumulated minimum and maximum digital peak values into storage latches. The acquisition clock is also used to latch the respective accumulated maximum and minimum digital peak values into the respective acquisition memories 60A, 60B, 60C and 60D. It, therefore, requires two acquisition clocks to load both of the accumulated maximum and minimum digital peak detector values into the acquisition memories 60A, 60B, 60C and 60D. This requires that a rest strobes be sent to the digital peak detectors 44A, 44B, 44C, and 44D on every other acquisition clock to set the next digital value as the initial maximum and minimum peak values for a new acquisition interval of the digital peak detectors 44A, 44B, 44C, and 44D. In the preferred embodiment of the invention, the acquisition memories 60A, 60B, 60C and 60D are associated with each of the acquisition pipes 26A, 26B, 26C and 26D and not part of the instrument RAM memory 24.

The accumulated maximum and minimum digital peak values for each of the pipes are coupled to the microprocessor 20 where, under program control, the maximum and minimum digital peak values of the acquisition pipes 26A, 26B, 26C and 26D over the acquisition interval are compared and the maximum digital values and the minimum digital value are stored as the maximum and minimum digital peak values over the acquisition interval. The stored values are further processed for presentation on display 18.

A digital peak detector 10 has been described that acquires digital values representative of an input signal using multiple acquisition pipes. Each acquisition pipe receives a common sampling signal that is delayed for each pipe so that samples are acquired at an effective rate greater than the sample clock rate. Each pipe generates digital values at their respective offset sample rate and accumulates peak maximum and minimum digital values over an acquisition interval. The acquisition interval uses two acquisition clock pulses derived from the sample clock and a decimation value derived from a user defined acquisition rate. The accumulated maximum and minimum digital peak values for each of the pipes are compared using a microprocessor that is operating under program control to generate a maximum and minimum digital peak detector value for each acquisition interval.

Thus, an interleaved digital peak detector and method of operation has been described. Whereas many alteration and modifications to the present invention will be comprehended by a person skilled in the art after having read the foregoing description, it is to be understood that the particular embodiments shown and described by way of illustration are in no way intended to be considered limiting. For example, the acquisition circuits that include programmable decimators and latches are preferably implemented as a demultiplexer. Further, the acquisition channel has been described as having four acquisition pipes that are interleaved and preferably operating at certain sampling and acquisition rates. By adding additional pipes, it is equally possible to operate the interleaved digital peak detector using different sample clock rates and acquisition rates and generate the same digital peak detector values as described in the preferred embodiment. References to details of particular embodiments are not intended to limit the scope of the appended claims.

What is claimed is:

1. An interleaved digital peak detector comprising:

a plurality of acquisition pipes coupled to receive an input signal, each acquisition pipe comprising:

an analog-to-digital converter receiving and digitizing the input signal and a sampling clock signal with the sampling clock signal for each pipe being coupled through a delay circuit to selectively delay the sampling of the input signal for each acquisition pipe;

a peak detector receiving the output from the analog-to-digital converter and accumulating maximum and minimum values of the digitized input signal;

an acquisition circuit receiving an acquisition clock signal derived by decimating the sampling clock signal as a function of a decimation value for triggering a latch circuit that stores the accumulated maximum and minimum values from the peak detector; and means for comparing the accumulated maximum and minimum values from each of the acquisition circuits over an acquisition interval for generating a maximum and a minimum peak detector value over the acquisition interval for the plurality of acquisition pipes.

2. The interleaved digital peak detector as recited in claim 1 wherein the analog-to-digital converter further comprises a track-and-hold circuit that captures an analog value for inputting to the analog-to-digital converter.

3. The interleaved digital peak detector as recited in claim 1 wherein the latch circuit of the acquisition circuit stores the maximum and minimum values of the peak detector over the acquisition interval.

4. An interleaved digital peak detector comprising:

a plurality of acquisition pipes coupled to receive an input signal, each acquisition pipe comprising:

an analog-to-digital converter receiving and digitizing the input signal and a sampling clock signal with the sampling clock signal for each pipe being coupled through a delay circuit to selectively delay the sampling of the input signal for each acquisition pipe;

a peak detector receiving the output from the analog-to-digital converter and accumulating maximum and minimum values of the digitized input signal;

a programmable decimator receiving the sampling clock signal and a decimation value for establishing an acquisition clock by decimating the sampling clock signal as a function of the decimation value that triggers a latch circuit for storing the accumulated maximum and minimum values from the peak detector;

an acquisition memory storing the latched maximum and minimum values from the peak detector over an acquisition interval of two cycles of the acquisition clock; and means for comparing the accumulated maximum and minimum values from each of the acquisition circuits over the acquisition interval for generating a maximum and a minimum peak detector value over the acquisition interval for the plurality of acquisition pipes.

5. The interleaved digital peak detector as recited in claim 1 wherein the analog-to-digital converter further comprises a track-and-hold circuit that captures an analog value for inputting to the analog-to-digital converter.

6. A method for detecting maximum and minimum digital values in an acquisition system comprising the steps of:

(a) digitizing an input signal using multiple acquisition pipes with each pipe having an analog-to-digital converter that receives a common sampling clock signal that is adjustably delayed by a delay circuit in each of the pipes;

(b) accumulating maximum and minimum peak values of the digitized input signal in each acquisition pipe over an acquisition interval;

(c) storing the accumulated maximum and minimum peak values of the digitized input signal in each acquisition pipe over the acquisition interval; and (d) comparing the stored accumulated maximum and minimum peak values of the digitized input signal from each of the acquisition pipes over the acquisition interval for generating a maximum and a minimum peak detector values over the acquisition interval.

7. The method for detecting maximum and minimum digital values in an acquisition system as recited in claim 6 further comprising the step of displaying the maximum and minimum peak detector values.

8. The method for detecting maximum and minimum digital values in an acquisition system as recited in claim 7 further comprising the steps repeating step (a) through (d) over additional acquisition intervals and displaying the maximum and minimum peak detector values for the additional intervals.

9. The method for detecting maximum and minimum digital values in an acquisition system as recited in claim 6 wherein the digitizing step further comprising the step of capturing an analog value of the input signal at the instant of the sampling clock signal for digitizing by the analog-to-digital converter.

* * * * *